(12) United States Patent
Dodabalapur et al.

(10) Patent No.: US 6,278,127 B1
(45) Date of Patent: *Aug. 21, 2001

(54) ARTICLE COMPRISING AN ORGANIC THIN FILM TRANSISTOR ADAPTED FOR BIASING TO FORM A N-TYPE OR A P-TYPE TRANSISTOR

(75) Inventors: Ananth Dodabalapur, Millington; Robert Cort Haddon, Dover; Howard Edan Katz, Summit; Luisa Torsi, Murray Hill, all of NJ (US)

(73) Assignee: Agere Systems Guardian Corp., Miami Lakes, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 8 days.

(21) Appl. No.: 08/441,142

(22) Filed: May 15, 1995

Related U.S. Application Data

(63) Continuation-in-part of application No. 08/353,024, filed on Dec. 9, 1994, now abandoned, which is a continuation of application No. 08/644,596, filed on May 10, 1996, now Pat. No. 5,596,208.

(51) Int. Cl.$^7$ .................................................. H01L 51/00
(52) U.S. Cl. ............................ 257/40; 257/66; 257/369
(58) Field of Search ............................. 257/40, 347, 350, 257/351, 66, 369

(56) References Cited

U.S. PATENT DOCUMENTS

| | | | |
|---|---|---|---|
| 4,021,835 | * | 5/1977 | Etoh et al. ............................. 357/23 |
| 4,065,781 | * | 12/1977 | Gutknecht ............................. 257/66 |
| 5,247,193 | * | 9/1993 | Menda ................................. 257/85 |
| 5,315,129 | * | 5/1994 | Forrest et al. ....................... 257/21 |
| 5,331,183 | * | 7/1994 | Sariciftci et al. ..................... 257/40 |
| 5,347,144 | * | 9/1994 | Gamier ............................... 257/40 |
| 5,350,459 | * | 9/1994 | Suzuki et al. ...................... 136/263 |
| 5,355,235 | * | 10/1994 | Nishizawa et al. ................. 257/210 |
| 5,442,198 | * | 8/1995 | Arai et al. ........................... 257/64 |
| 5,500,537 | * | 3/1996 | Tsumura et al. ..................... 257/40 |
| 5,525,811 | * | 6/1996 | Sakurai et al. ...................... 257/40 |
| 5,574,291 | * | 11/1996 | Dodabalapur et al. .............. 257/40 |
| 5,612,228 | * | 3/1997 | Shieh et al. ........................... 437/1 |

FOREIGN PATENT DOCUMENTS

| | | | | |
|---|---|---|---|---|
| 0113540 | * | 12/1983 | (EP) | .............................. H01L/29/80 |
| 0528662 A1 | * | 8/1992 | (EP) | ............................ H01L/29/784 |
| 0546665 A2 | * | 10/1992 | (EP) | ............................ H01L/29/784 |
| 01259563 | * | 4/1988 | (JP) | .............................. H01L/29/78 |
| 403151667A | * | 6/1991 | (JP) | .............................. H01L/29/28 |
| 4-158576 | * | 6/1992 | (JP) | ..................................... 257/40 |
| 548094 | * | 2/1993 | (JP) | ............................ H01L/29/784 |
| 5152560 | * | 6/1993 | (JP) | .............................. H01L/29/28 |
| 6273811 | * | 9/1994 | (JP) | ................................ G02L/1/35 |

OTHER PUBLICATIONS

Gaensslen et al, IBM Tech Disel Ball vol. 13 No. 11 Apr. 1971 p. 3345.*

(List continued on next page.)

*Primary Examiner*—Olik Chaudhuri
*Assistant Examiner*—Ginette Peralta

(57) ABSTRACT

Disclosed are organic thin film transistors that can be either n-channel or p-channel transistors, depending on biasing conditions. Such transistors are expected to find wide use in complementary circuits. A specific embodiment of the inventive transistor comprises a 15 nm thick layer of α-6T with a 40 nm thick layer of $C_{60}$ thereon. The latter was protected against degradation by the ambient by means of an appropriate electrically inert layer, specifically by a 40 nm α-6T layer.

10 Claims, 7 Drawing Sheets

OTHER PUBLICATIONS

Dodabalapur et al., *Appl. Phys, Lett,* American Institute of Physics Hybrid Organic/Inorganic Complementary Circuits, vol. 68, 16, pp. 2246–2248, Apr. 15, 1996.*

Dodabalapur et al., *Science,* "Organic Heterostructure Field–Effect Transistors", vol. 269, pp. 1560–1562, Sep. 15, 1995.*

Katz et al., *Proceedings of the PMSE Division of the American Chemical Society,* "Synthesis and Superior Transistor Performance of Dopant–Free Thiophene Hexamers", vol. 72, pp. 467–469, 1995.*

Kanicki, "Amorphous and Microcrystalline Semiconductor Devices: Optoel; ectronic Devices", pp. 102–103, 1991.*

"All–Polymer Field–Effect Transistor Realized by Printing Techniques", by F. Garnier et al., *Science,* vol. 265, Sep. 16, 1994, pp. 1684–1688.

"Polythiophene Field–Effect Transistor With Polypyrrole Worked As Source And Drain Electrodes", by H. Koezuka et al., *Applied Physics Letters,* vol. 61 (15), Apr. 12, 1993, pp. 1794–1796.

"Polythienylenevinylene Thin–Film Transistor With High Carrier Mobility", by H. Fuchigami et al., *Applied Physics Letters,* vol. 63 (10), Sep. 6, 1993, pp. 1372–1374.

"An Analytical Model For Organic–Based Thin–Film Transistors", by G. Horowitz, *Journal of Applied Physics,* vol. 70 (1), Jul. 1, 1991, pp. 469–475.

"Thin–Film Transistors Based on Alpha–Conjugated Oligomers", by G. Horowitz et al., *Synthetic Metals,* 41–43 (1991), pp. 1127–1130.

"Junction Field–Effect Transistor Using Polythiophene As An Active Component", by S. Miyauchi, *Synthetic Metals,* 41–43 (1991), pp. 1155–1158.

"Organic Transistors: Two–Dimensional Transport And Improved Electrical Characteristics", by A. Dodabalapur, *Science,* vol. 268, Apr. 14, 1995, pp. 270–271.

Chapter 5, Fullerenes: Synthesis, Properties, and Chemistry, Conductivity and Superconductivity in Alkali Metal Doped $C_{60}$, by R. C. Haddon et al., ACS Symposium Ser. No. 481 (1992) pp. 71–89.

* cited by examiner

ARTICLE COMPRISING AN ORGANIC THIN FILM TRANSISTOR ADAPTED FOR BIASING TO FORM A N-TYPE OR A P-TYPE TRANSISTOR

RELATED APPLICATION

This is a continuation-in-part application of application Ser. No. 08/353,024, filed Dec. 9, 1994 now abandoned by A. Dodabalapur et al. which is the parent of continuation application Ser. No. 08/644,596, filed May 10, 1996 now U.S. Pat. No. 5,596,208.

FIELD OF THE INVENTION

This invention pertains to thin film transistors (TFTs), more specifically, to TFTs that comprise organic active layer material.

BACKGROUND OF THE INVENTION

Thin film transistors (TFTs) are known, and are of considerable commercial significance. For instance, amorphous silicon-based TFTs are used in a large fraction of active matrix liquid crystal displays.

TFTs with an organic active layer are also known. See, for instance, F. Garnier et al., *Science*, Vol. 265, pp. 1684–1686; H. Koezuka et al., *Applied Physics Letters*, Vol. 62 (15), pp. 1794–1796; H. Fuchigami et al., *Applied Physics Letters*, Vol. 63 (10), pp. 1372–1374; G. Horowitz et al., *J. Applied Physics*, Vol. 70 (1), pp. 469–475, and G. Horowitz et al., *Synthetic Metals*, Vol. 41–43, pp. 1127–1130. These devices typically are field effect transistors (FETs). Such devices potentially have significant advantages over conventional TFTs, including a potentially simpler (and consequently cheaper) fabrication process, the possibility for low temperature processing, and compatibility with non-glass (e.g, plastic) substrates. Bipolar transistors that utilize both p-type and n-type organic material are also known. See, for instance, U.S. Pat. No. 5,315,129. S. Miyauchi et al., *Synthetic Metals*, 41–43 (1991), pp. 1155–1158, disclose a junction FET that comprises a layer of p-type polythiophene on n-type silicon.

However, despite considerable research and development effort, "organic" TFTs have not yet reached commercialization, at least in part due to relatively poor device characteristics of prior art organic TFTs.

An important device characteristic of a switching transistor is the on/off ratio of the source/drain current. Prior art organic TFTs typically have relatively low on/off ratios. For instance, H. Fuchigami et al. (op. cit.) recently reported a device that had carrier mobility comparable to amorphous silicon, but had an on/off ratio of only about 20 at −30V gate-source voltage. That paper also discloses purification of semiconducting materials to reduce the carrier scattering by impurities.

H. Koezuka et al. (op. cit.) report attainment of an on/off ratio (modulation ratio) of the channel current of about $10^5$ in a device with doped polypyrole-coated (a highly conducting polymer) source and drain contacts. According to these authors, this is the highest on/off ratio achieved in organic FETs. Nevertheless, the reported on/off ratio is still substantially smaller than on/off ratios typically available in conventional FETs and demanded for many potential applications of organic TFTs. Furthermore, the organic TFT had very low carrier mobility ($2 \times 10^{-4}$ cm$^2$/V·s), and thus would not have been suitable for high-speed operation. European patent application No. 92307470.2 (publication No. 0 528 662 A1) discloses an organic FET that comprises a first organic layer that constitutes a channel between source and drain electrodes and is in contact with a second organic layer that is disposed between the gate electrode and the source and drain electrodes. The first and second organic layers are of the same conductivity type but differ in their carrier concentration.

In view of the potential significance of organic TFTs, it would be desirable to have available such devices that have improved characteristics, including improved on/off ratio of the source/drain current. This application discloses such devices, and a method of making the devices.

U.S. patent application Ser. No. 08/353,032, filed Dec. 9, 1994 by A. Dodabalapur et al., discloses articles that comprise improved organic thin film transistors and a method of making the transistors, and U.S. patent application Ser. No. 08/404,221, filed Mar. 15, 1995 by R. C. Haddon et al., discloses a $C_{60}$-based organic transistor. See also A. Dodabalapur et al., *Science*, Vol. 268, p. 270 (1995). All of these are incorporated herein by reference.

Definitions and Glossary

An "organic semiconductor" herein is a material that contains a substantial amount of carbon in combination with other elements, or that comprises an allotrope of elemental carbon (excluding diamond), and exhibits charge carrier mobility of at least $10^{-3}$ cm$^2$/V·s at room temperature (20° C.). Organic semiconductors of interest herein will typically have conductivity less than about 1S/cm at 20° C.

A "p-type" ("n-type") organic semiconductor herein is an organic semiconductor in which the Fermi energy is closer to (farther from) the energy of the highest occupied molecular orbital (HOMO) of the molecules or aggregates present in the material than it is to (from) the energy of the lowest unoccupied molecular orbital (LUMO). The term is also intended to mean an organic semiconductor which transports positive charge carriers more (less) efficiently than negative carriers. Positive (negative) carriers are generally referred to as "holes" ("electrons").

An organic "p-n junction" herein is the contact region between a p-type and a n-type organic semiconductor.

SUMMARY OF THE INVENTION

In a broad aspect the invention is embodied in an article that comprises a novel organic TFT that can have substantially improved characteristics (e.g., on/off ratio), as compared to prior art organic TFTs. Some embodiments of the invention can exhibit p-channel or n-channel transistor behavior, depending on biasing conditions, and need not necessarily have high on/off ratio.

Specifically, the organic TFT comprises organic material, spaced apart first and second contact means (e.g., gold electrodes) in contact with the organic material, and third contact means that are spaced from each of the first and second contact means and that are adapted for controlling, by means of a voltage applied to the third contact means, a current between the first and the second contact means. Significantly, the organic material comprises a layer of a first organic material of a first conductivity type and a layer of a second organic material of a second conductivity type that is in contact with the layer of the first organic material at least in a region between the first and second contact means and forms a p-n junction with the layer of first organic material, the layer of the first organic material being in contact with each of the first and second contact means and being not in contact with the third contact means. The third contact means generally can be identified with the gate contact in prior art devices, and the first and second contact means with the source and drain contacts of prior art devices.

Exemplarily, a TFT according to the invention has exhibited an on/off ratio of more than $10^6$, substantially higher than the ratios exhibited by prior art organic TFTs. The exemplary TFT according to the invention furthermore exhibited relatively high carrier mobility, in excess of 0.003 $cm^2/V \cdot s$. Desirably, TFTs according to the invention exhibit an on/off ratio greater than $10^5$ at an operating gate voltage, and a carrier mobility of at least $3 \times 10^{-3}$ $cm^2/V \cdot s$, all at 20° C.

The layer of the first organic material in TFTs according to the invention can comprise any of the organic materials known to be suitable for use as the active layer in organic TFTs. Among these materials are polythiophene and substituted derivatives thereof such as poly(3-hexylthiophene and poly(3-octylthiophene) polythienylenevinylene, α-hexathienylene (α-6T) and substituted derivatives thereof such as α, ω-dihexyl-α-6T. Other suitable first organic materials are disclosed in U.S. Pat. No. 5,315,129 and in G. Horowitz et al., *Synthetic Metals*., Vol. 41–43, pp. 1127–1130, both incorporated herein by reference. Exemplarily, the first organic material is selected from polymers of thiophene of degree of polymerization greater than three (and typically less than 9), polymers of substituted derivatives of thiophene, and poly(thienylenevinylene). Recently we have shown that 2, 2'-bis (benzo [1,2-b: 4,5-b']dithiophene can have p-type mobility of $>10^{-4}$ $cm^2/V \cdot s$ in a TFT, with excellent on/off ratio and thermal stability. This compound, as well as its tris analog and substituted derivatives, is contemplated for use in TFTs according to the invention.

The above recited compounds are p-type organic semiconductors, but the invention is not so limited. We currently believe that other organic compounds that can be deposited in thin film form and that are n-type are also likely to be suitable for use as the first organic material in transistors according to the invention, and use of these compounds is contemplated. We currently prefer first organic semiconductor materials that can be deposited in crystalline (typically polycrystalline) form, but amorphous layers may also have utility.

Among the second organic materials that are suitable for use in the invention is $C_{60}$. However, the invention is not so limited, and the use of other organic materials, including p-type materials, is contemplated. Among n-type organic semiconductors that are likely to be useful are other fullerenes (e.g., $C_{70}$ and homologs), perylene tetracarboxylic anhydrides and imides and substituted derivatives (e.g., perylene tetracarboxylic dianhydride or PTCDA), oxadiazole compounds, tetracyanoquino-dimethanes (e.g., 7, 7, 8, 8-tetracyanoquinodimethane and its dibenzo derivative), porphyrins and quinones. Exemplary substituents are nitro, cyano, halo and perfluoroalkyl substituents, with other alkyls also being potentially useful. Those skilled in the art will appreciate that not all n-type organic semiconductor materials will necessarily be useful in the practice of this invention. Indeed, there are materials (e.g., Alq) that are useful in the practice of the invention of the '024 patent application but are currently not thought to be useful in the practice of the instant invention.

In a first exemplary embodiment of the invention the transistor further comprises a dielectric layer disposed between the third contact means and both of the first and second contact means, with the first organic material layer in contact with the dielectric layer. Transistors of this embodiment have a structure analogous to that of conventional metal-insulator-semiconductor (MIS) FETs and will be referred to as organic TFTs of the MIS-FET type.

In a second exemplary embodiment the third contact means of the transistor are disposed on the second organic material layer and are spaced from the first organic material layer. Transistors of this embodiment have a structure analogous to that of conventional junction FETs (J-FETs) and will be referred to as organic TFTs of the J-FET type.

A third exemplary embodiment is similar to the above first embodiment, but with the order of the first and second organic material layers interchanged.

Transistors according to the invention are advantageously used in articles such as display systems, memories, and other analog amd/or digital circuits.

A further embodiment of the invention is an organic thin film transistor capable of operation as either a p-channel or n-channel device, and multi-transistor circuits that comprise such transistors. These TFTs do not necessarily possess as high on/off ratios as do some of the previously disclosed p-channel TFTs.

DETAILED DESCRIPTION

Figure 1:
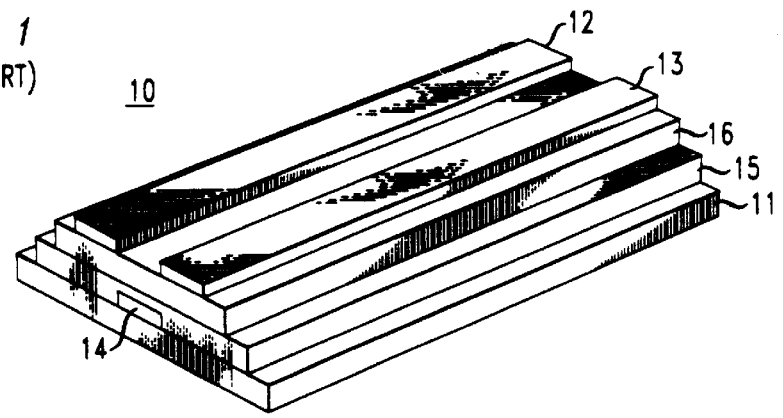
FIG. 1 schematically shows an exemplary prior art organic TFT.

Prior art organic TFTs typically are MIS-FET-,type or hybrid J-FET-type transistors and can be embodied in a variety of structures. An exemplary prior art MIS-FET-type TFT (10) with organic active layer is schematically depicted in FIG. 1, wherein numerals 11–16 refer, respectively, to the substrate (e.g., glass, plastic, metal, semiconductor), source electrode, drain electrode, gate electrode, gate insulator layer and organic active material (organic semiconductor) layer. As those skilled in the art will appreciate, means for causing the flow of charge carriers between source and drain, and means for applying a voltage to the gate electrode will be present in a working device but are not shown.

Figure 2:
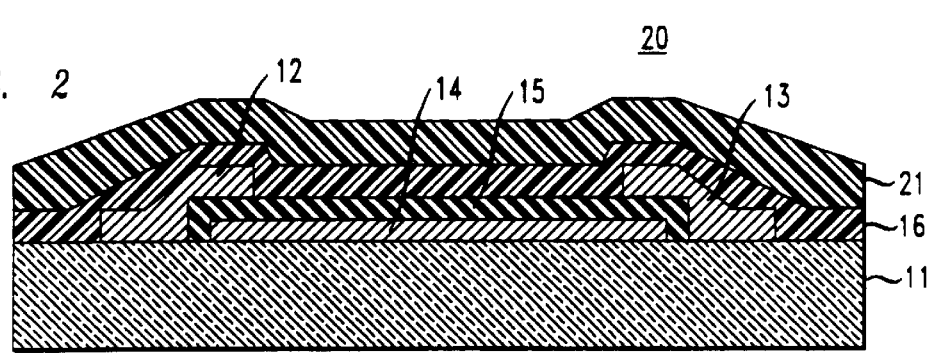
FIGS. 2–4 schematically show exemplary transistors according to the invention.

FIG. 2 schematically shows an exemplary MIS-FET-type device (20) according to the invention. Numerals 11–16 refer to elements that respectively correspond to elements of the same reference numeral in FIG. 1, and numeral 21 refers to an organic material layer that is of the opposite conductivity type as layer 16, and forms a p-n junction therewith. Exemplarily, layer 16 is p-type (e.g., α-6T) and layer 21 is n-type (e.g., Alq).

We have discovered that provision of an appropriate layer 21 can result in substantially improved device performance, typically a significant decrease in the "off" current between source and drain, with corresponding increase in the on/off ratio of the transistor.

We currently believe that the decrease in the "off" current is associated with the contact between appropriate organic layers 16 and 21, e.g., the α-6T/Alq interface, and attendant depletion of the (p-type) residual carriers in the layer (e.g., 16) of first organic material.

By analogy with conventional p-n junctions, it (an be said that the width W of the depletion layer formed at the first/second organic material interface at zero bias is $(2\epsilon_1 V_{bi}/qN_1)^{1/2}$, where $\epsilon_1$ is the dielectric constarit of the first organic material, $V_{bi}$ is the "built-in" potential $|E_{F1}-E_{F2}|/q$, $N_1$ is the free carrier density in the first organic material, q is the elementary charge ($1.6 \times 10^{-19}$C), and $E_{F1}$ and $E_{F2}$ are the Fermi energy in the first and second organic materials, respectively. In the above expression for W it is assumed that the second organic material has much higher free carrier density than the first organic material.

We currently believe that the presence of a depletion region of non-zero width at zero bias results in lower current between the first and second contact means ($I_D$) at zero bias by causing many of the free carriers in the first organic material layer to be electrically inactive.

The above remarks are offered for tutorial reasons only, and are not intended to limit the claims.

A significant feature of transistors according to the invention is a relatively large (e.g., >0.5V) value of $V_{bi}$. This in turn requires a relatively large difference in Fermi energy between the first and second organic materials.

Figure 8:
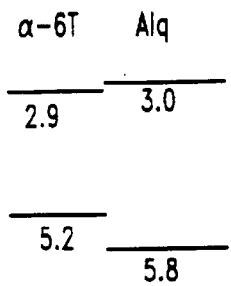
FIGS 8 and 9 schematically show the band edge alignment of isolated α-6T and Alq, and the band edge of a α-6T in contact with Alq.
Figure 9:
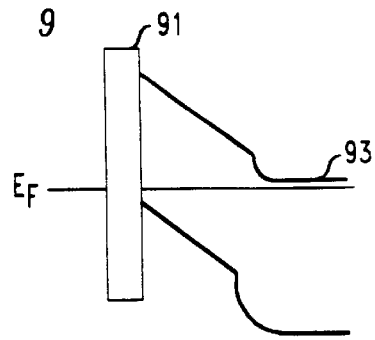

This is exemplarily illustrated in FIGS. 8 and 9, which schematically respectively show the band edge alignment of isolated α-6T and Alq, and the band edges of α-6T in contact with Alq. As is well known, α-6T and Alq are recognized as p-type and n-type organic semiconductors, respectively. The numerical values in FIG. 8 are in electron volts, and numerals 91–93 in FIG. 9 refer to insulator, α-6T and Alq, respectively.

Figure 5:
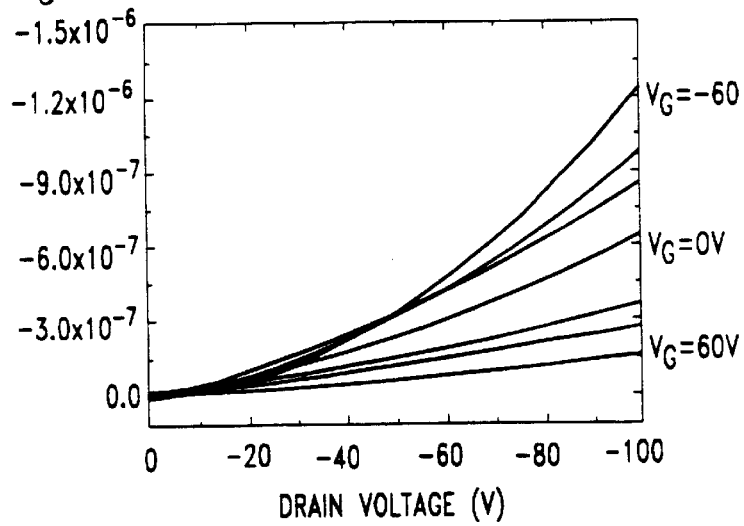
FIGS. 5 and 6 show performance data of a MIS-FET-type transistor before and after provision of a second organic material layer.
Figure 6:
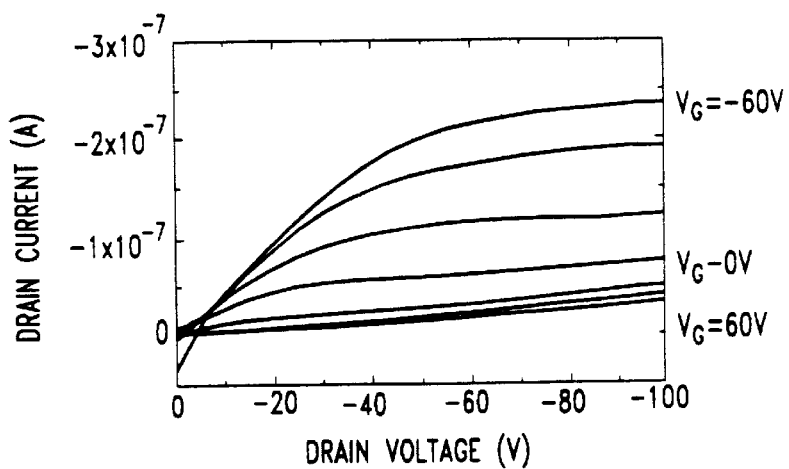

FIGS. 5 and 6 show comparative data for a MIS-IFET-type organic TFT without and with second organic material layer, respectively. The data of FIG. 5 were obtained from a transistor of the type shown in FIG. 2, but without layer 21. The substrate was silicon, the gate contact was a 30 nm thick gold stripe. The gate dielectric was a 300 nm thick layer of conventionally formed $SiO_2$. The gold source and drain electrodes were 30 nm thick, 250 μm long and 100 μm wide, and were spaced apart by a distance of 12 μm. The p-type organic semiconductor layer was 50 nm thick α-6T. The data of FIG. 6 were obtained from the above described transistor, but with a 60 nm thick Alq layer deposited on the α-6T layer. As can be seen from the figures, provision of the Alq layer resulted in a significant decrease in drain current ($I_D$) at zero gate bias ($V_G$=0), exemplarily from –1.1 μA to –68 nA.

Figure 3:
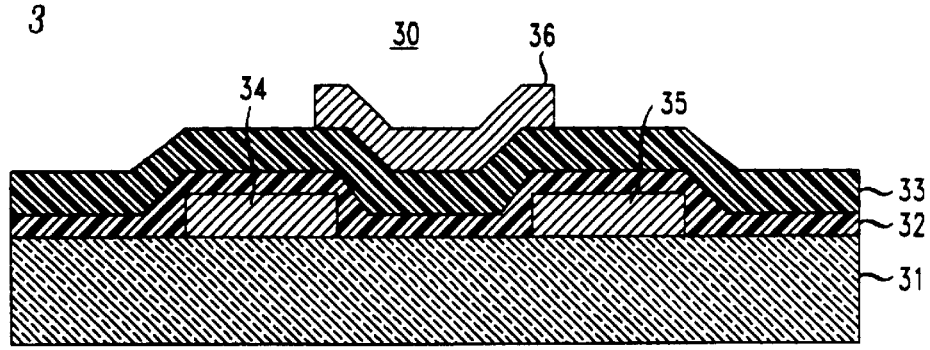
Figure 7:
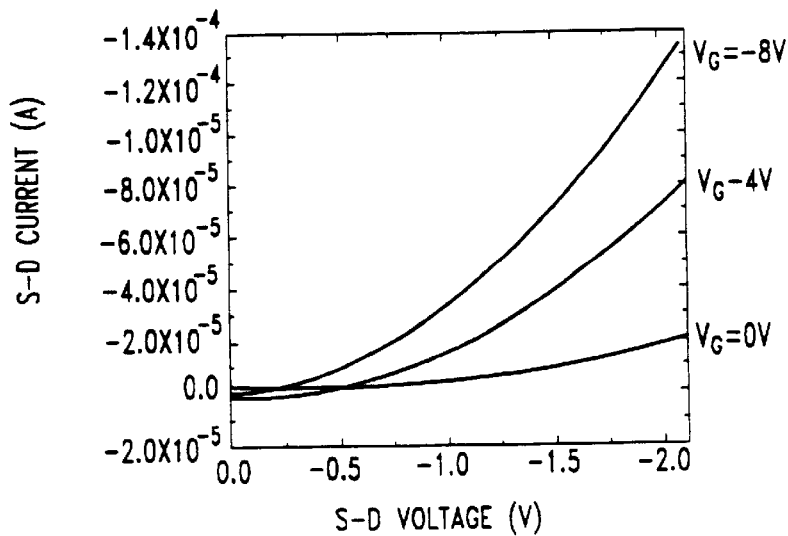
FIG. 7 shows performance data of a J-FET-type transistor according to the invention.

FIG. 7 shows similar performance data for a J-FET-type organic TFT according to the invention. As can be seen, the device has desirably low $I_D$ at $V_G$=0. FIG. 3 schematically depicts a J-FET-type organic TFT (30) according to the invention, with numerals 31–36 designating the insulating substrate, first organic material layer, second organic material layer, first contact means, second contact means, and third contact means, respectively.

Figure 4:
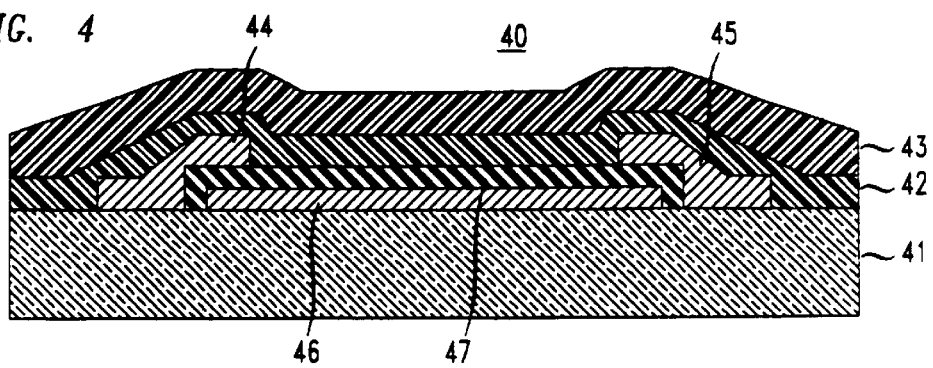

FIG. 4 schematically depicts a further exemplary embodiment of the invention that corresponds to the above described third embodiment. Numerals 41–47 refer, respectively, to the substrate, first organic semiconductor layer, second organic semiconductor layer, first contact, second contact, third contact, and gate dielectric. It will be understood that in this embodiment layer 42 is n-type organic semiconductor material.

The data of FIG. 7 were obtained from a TFT of the general type shown in FIG. 3. Specifically, the substrate was $SiO_2$-coated Si. An inter-digitated set of source/drain electrodes (10 nm Cr/30 nm Au) were formed on the substrate. The width and spacing of the fingers of the digitated structure was 10 μm; the overall dimensions of the structure are 2 mm×2 mm. A 50 nm layer of α-6T was evaporated over the interdigitated structure, and a 60 nm layer of Alq was evaporated onto the α-6T layer. A 100 nm thick and 3 mm wide finger of Al, defined by means of a shadow mask, was deposited on the Alq layer so as to extend across the source/drain spacing. The Al finger served as the gate electrode.

Transistor according to the invention can be produced by any appropriate method on any suitable substrate. Exemplary substrates are glass, plastics such as MYLAR® or KAPTON®, or Si (coated with $SiO_2$ or uncoated).

Although provisions of a second organic material layer will generally result in improved device characteristics if the first organic material is of a purity that is conventionally found in prior art devices, we have also found that, at least in the case of the devices that compromise α-6T, the use of higher purity first organic material may result in additional improvement in device characteristics. Techniques for purifying α-6T are described in our concurrently filed co-assigned patent application entitled "Method of Making an Organic Thin Film Transistor, and Article Made by the Method".

We have also found that an appropriate heat treatment of the deposited first organic material (e.g., α-6T) can change the morphology of the layer, and consequently further improve device characteristics. More specifically, we have found that rapid thermal annealing (RTA) of deposited films of α-6T can substantially increase the grain size of the material, to the extent that average grain size can exceed the channel length (typically 4–12 μm) of the intended TFT. If this is the case then the active material can behave substantially like a single crystal.

Typical as-deposited films of α-6T are polycrystalline, with average grain size of about 100 nm or less. Annealing such films for a short time (typically less than 10 seconds, e.g., 1 second) at a temperature close to, the melting point (e.g., 295–315° C.) exemplary about 5–100 μm. Annealing is desirably in an inert atmosphere, e.g. $N_2$. Any suitale heat source (e.g., a bank of halogen lamps focused to a suspector, or a graphite strip heater) can be used.

Although in many cases the carrier mobility in the p-type material will be substantially higher than the mobility in the n-type material (exemplarily by a factor of 100 or more), it may at times be advantageous if the respective mobilities in the two materials are comparable (e.g., are within a factor of about 10 of each other). If this is the case then it wilkl be possible, by appropriate biasing of the gate electrode in a MIS-FET type structure such as is shown in FIG. 2, to obtain either an n-channel or a p-channel transistor. Those skilled in the art will recognize that the ability to form either n-orp-channel transistors make possible to the invention s building blocks in complementary analog and/or digital circuits. Such TFTs need not possoss very high on/off ratio in order to be useful.

Transistors according to the invention can be used as discrete devices but will more typically be used in integrated circuits that comprise a multiplicity of transistors according to the invention, possibly in conjunction with conventional semiconductor devices, with conductors interconnecting the devices and providing means for energizing the devices, providing input signals to the circuit and optionally receiving output signals therefrom.

Figure 10:
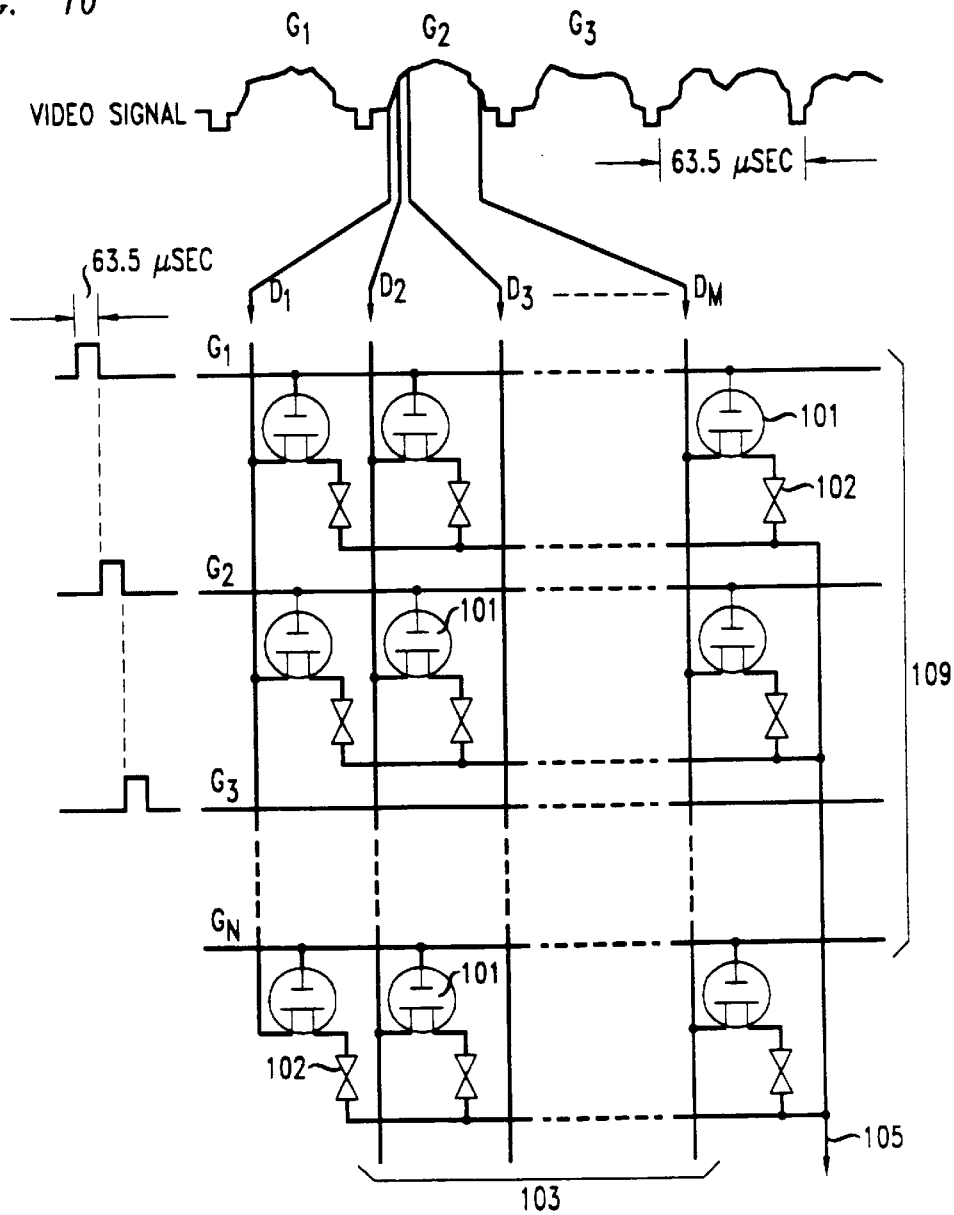
FIG. 10 shows an exemplary drive circuit in an active matrix liquid crystal display that compromises TFTs according to the invention.

By way of example, transistors according to the invention are used as current switches in liquid crystal displays in functionally the same way as prior art semiconductor TFTs are currently used. This is schematically illustrated in FIG. 10, which is based on an illustration at p. 102 of "Amorphous and Microcrystalline Devices", J. Kanicki, editor, Artech House, Boston (199 1). FIG. 10 depicts relevant aspects of an exemplary circuit diagram of an active-matrix liquid crystal display, wherein transistors 101 are TFTs according to the invention, and the remainder of the circuit is conventional. Numerals 102 refer to liquid crystal, and numerals 103–105 refer to signal lines, gate lines and common electrode, respectively. Video signals and gate pulses are also shown schematically.

Figure 11:
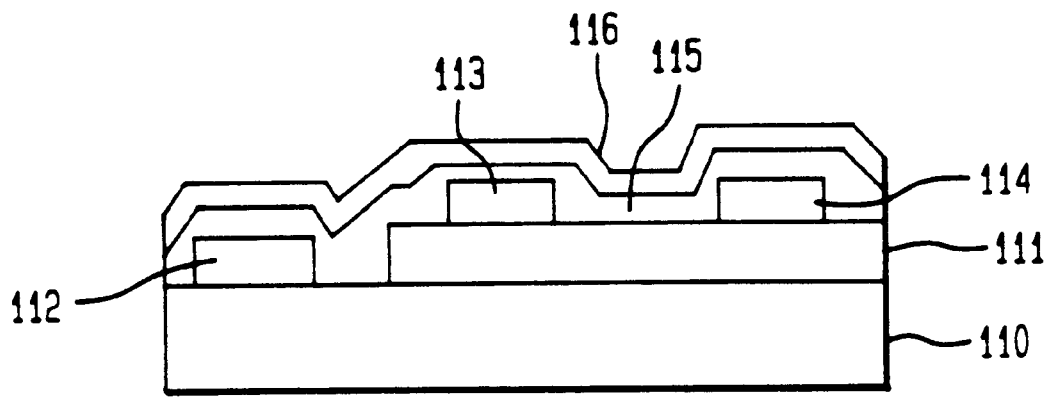
FIG. 11 schematically depicts an exemplary organic thin film transistor capable of p-channel and n-channel operation in a single device.

FIG. 11 schematically depicts an exemplary organic thin film transistor according to the invention. The transistor is capable of p-channel and n-channel operation in a single device. Reference numerals 110–116 refer to the silicon substrate 110 which serves as the gate, the gate dielectric 111 ($SiO_2$), the gate contact 112 (Au), the source 113 (Au), the drain 114 (Au), the p-type organic layer 115 ($\alpha$-6T) and the n-type organic layer 116 ($C_{60}$), respectively. As those skilled in the art will recognize, the transistor of FIG. 11 closely resembles that of FIG. 2. As those skilled in the art will recognize, either or both of layers 115 and 116 can comprise more than one organic compound.

In a currently preferred embodiment the p-type layer consists of $\alpha$-6T, is typically about 10–20 nm thick, and is disposed on the gate dielectric. The n-type layer consists of $C_{60}$, is typically about 20–40 nm thick, and is disposed on the p-type layer. It is typically desirable to provide an electrically inactive layer (e.g., SiO) on the n-type layer, to protect the n-type layer from the ambient.

It is not a requirement that the p-type material is disposed below the n-type material. However, we have attained better device characteristics for such transistors, as compared to transistors having the p-type layer disposed on the n-type layer. Furthermore, we have observed degradation of n-channel operation if the p-type layer is relatively thick (typically >40 nm). It thus appears desirable that the p-type layer is relatively thin (<40 nm, preferably <20 nm).

Figure 12:
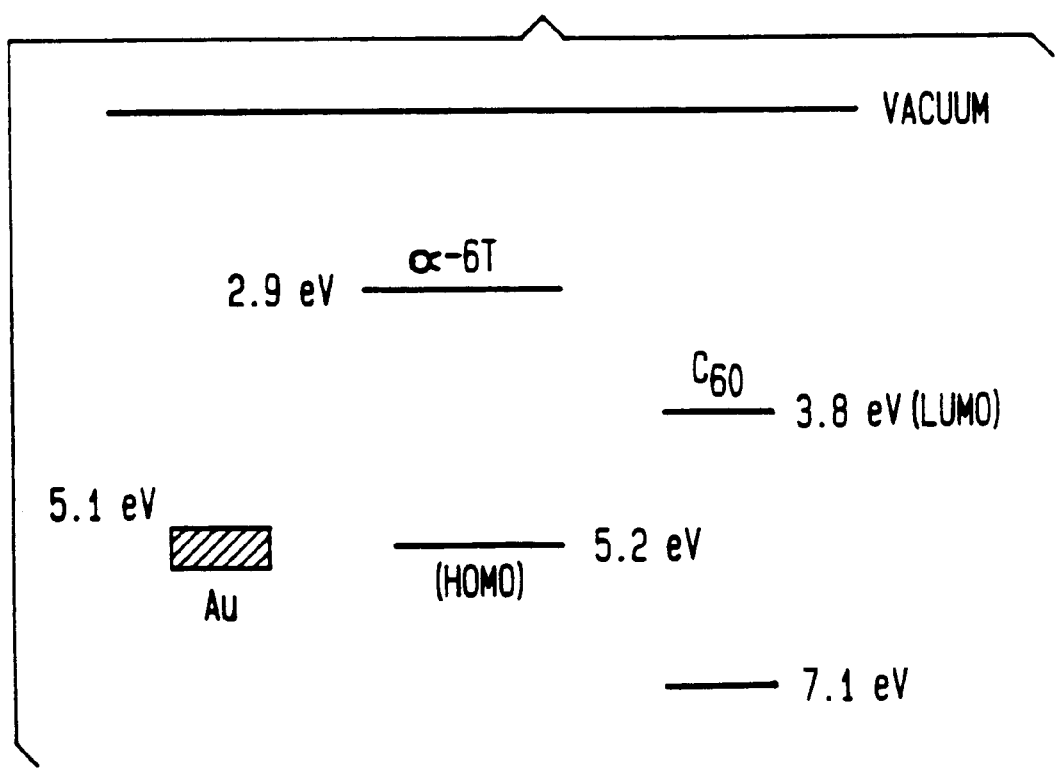
FIG. 12 shows the relevant energy levels of Au, α-6T and $C_{60}$.

The energy levels of the highest occupied molecular orbital (HOMO) and lowest unoccupied molecular orbitals (LUMO) $\alpha$-6T and $C_{60}$ are shown in FIG. 12. As those skilled in the art will recognize, these energy levels are such that, when the gate is biased negatively with respect to the source, the p-channel material $\alpha$-6T) is filled with holes, and when the gate is biased positively with respect to the source, the n-channel material ($C_{60}$) is filled with electrons.

Figure 14:
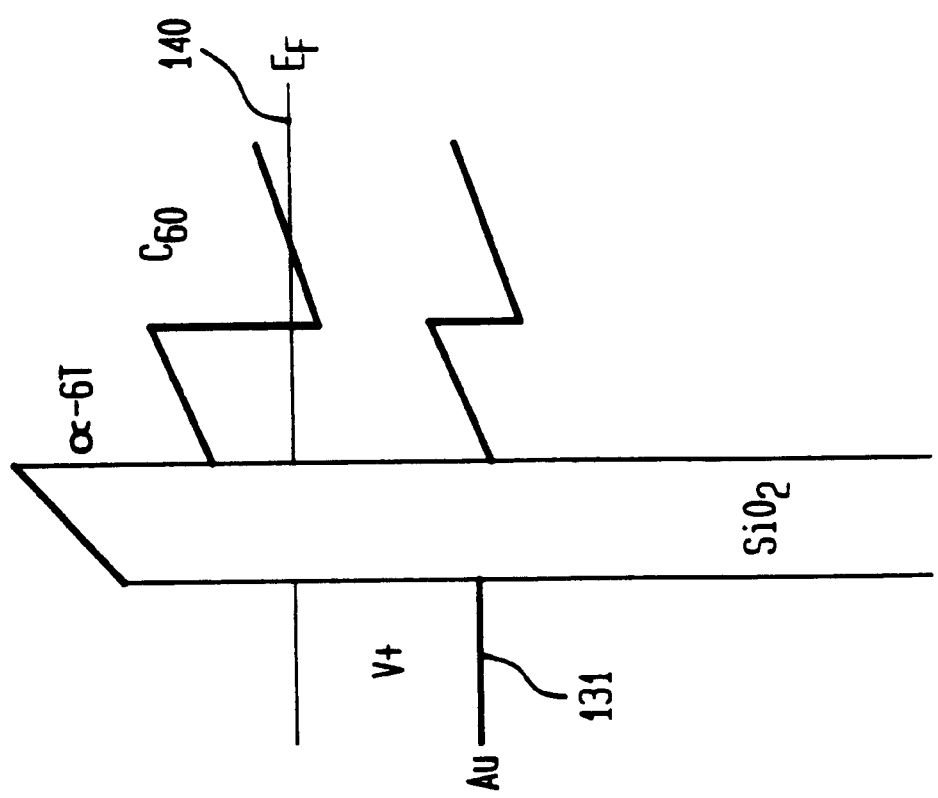
FIGS. 13 and 14 show energy band diagrams of the transistor according to the invention in the p-channel and n-channel enhancement mode, respectively.
Figure 13:
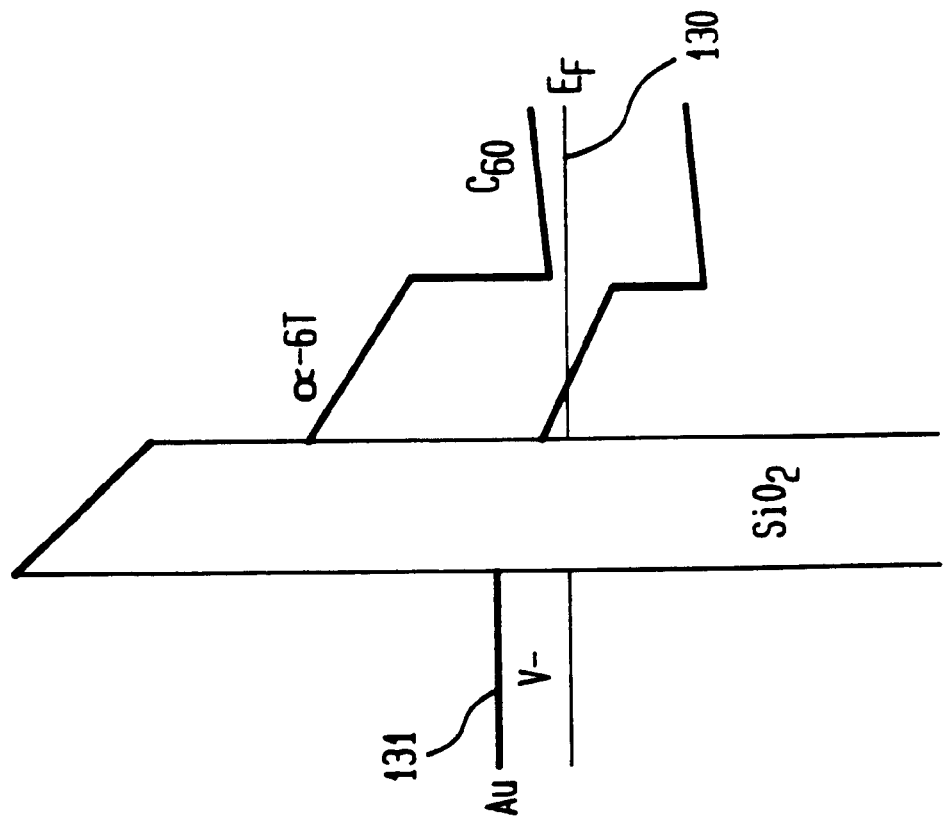

FIGS. 13 and 14 schematically show the energy band diagrams of an exemplary transistor according to FIG. 11 in the p-channel and n-channel modes of operation, respectively. In the p-channel mode an accumulation layer of holes is formed in the $\alpha$-6T near the $\alpha$-6T/$SiO_2$ interface, and in the n-channel mode an accumulation layer of electrons is formed in $C_{60}$ near the interface with $\alpha$-6T. FIGS. 13 and 14 assume an applied bias of –30 V and +60 V, respectively. Numerals 130 and 140 refer to the Fermi levels, and numeral 131 refers to the energy level of the metal contact.

Figure 15:
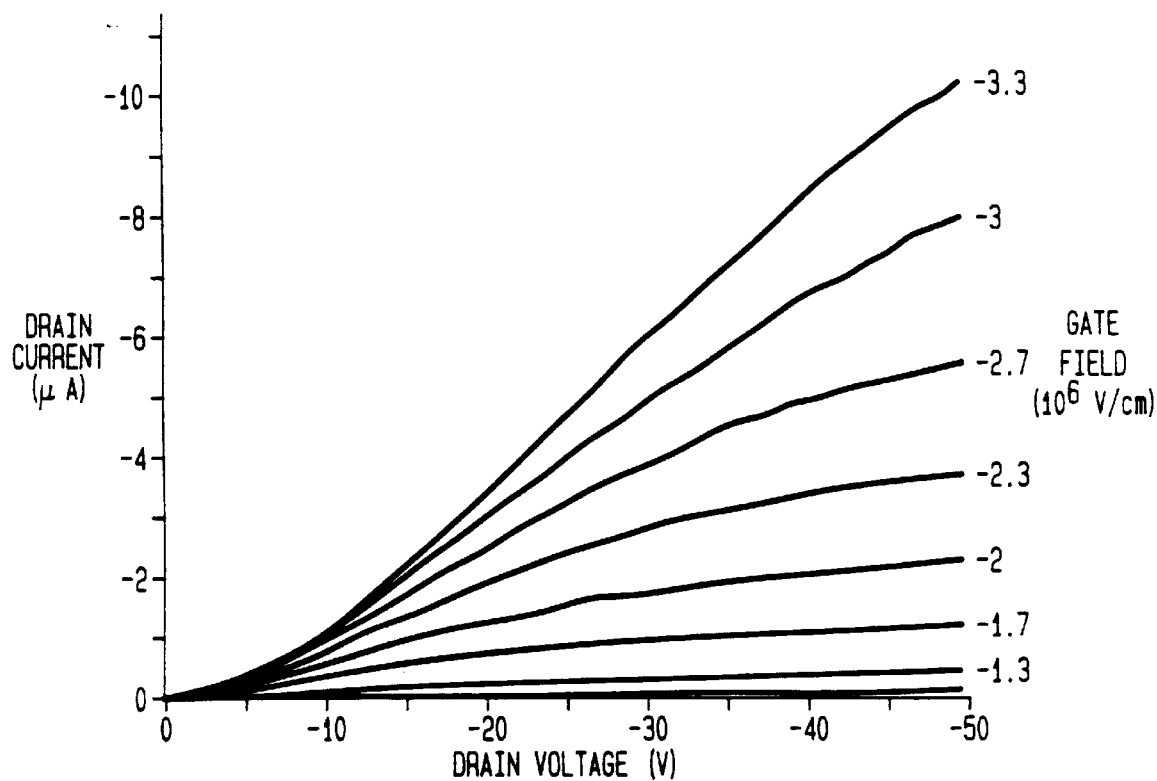
FIGS. 15 and 16 show transistor characteristics for p-channel and n-channel operation, respectively.
Figure 16:
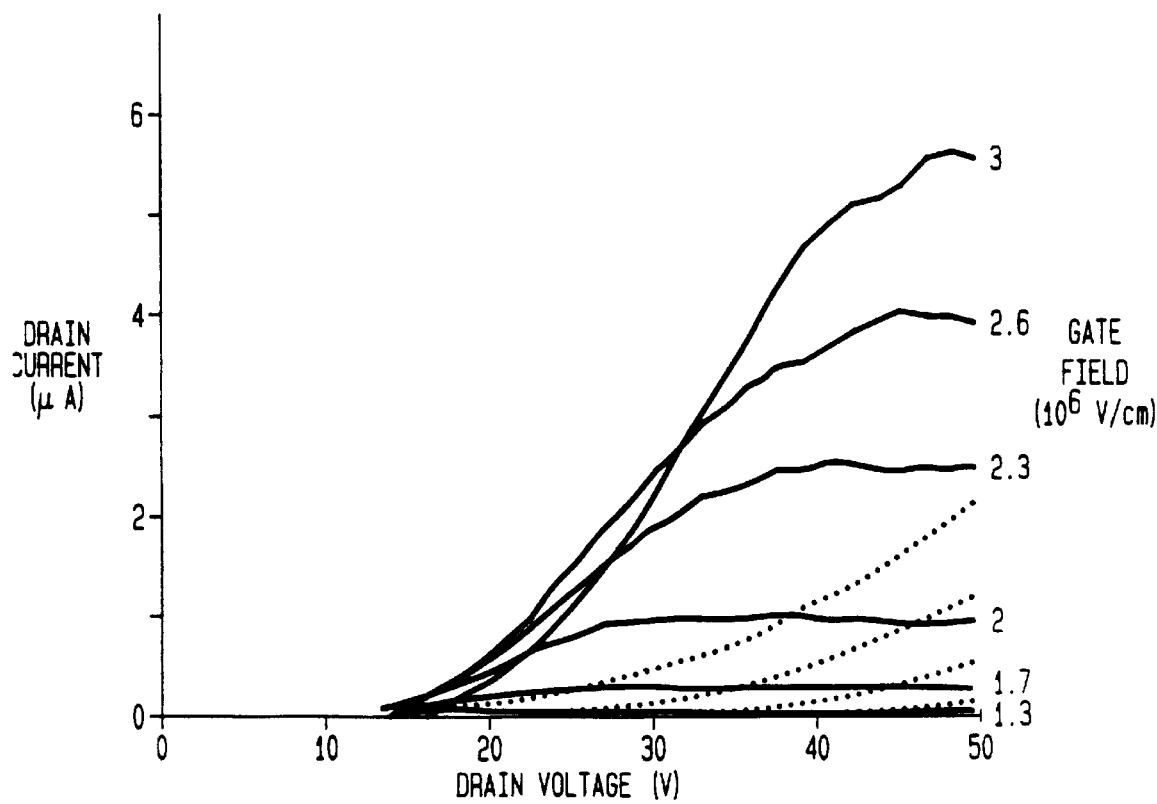

FIGS. 15 and 16 show drain current vs. drain voltage for an exemplary transistor according to FIG. 11, for p-channel and n-channel operation, respectively. It is to be emphasized that the data of FIGS. 15 and 16 were obtained from a single transistor, establishing that one and the same transistor can serve as either a p-channel or n-channel device. The dotted lines in FIG. 16 represent drain currents at low positive gate fields.

Although the discussion of complementary organic thin film transistors was in terms of $\alpha$-6T/$C_{60}$-based transistors, the invention is not so limited. We have, for instance, achieved results qualitatively similar to those of FIGS. 15 and 16 with a transistor of the type shown in FIG. 11, but with $\alpha$, $\omega$ hexyl 6T substituted for $\alpha$-6T, and we expect that many of the above recited first organic materials are suitable for use in p- and n-channel organic thin film transistors, provided they are used in a combination that has an energy band line-up similar to that of the $\alpha$-6T/$C_{60}$ combination of FIG. 12, and has appropriate transport properties. Specifically, the LUMO and HOMO of the p-channel materials must be closer to the vacuum level than the HOMO of the n-channel material.

The data of FIGS. 15 and 16 were analyzed with a model that takes into account short-channel effects, parasitic resistance, and field dependence of the carrier mobility. The p-channel mobility is about $4 \times 10^{-3}$ cm$^2$/V·s, and the threshold voltage is about 0 V. The n-channel mobility is about $5 \times 10^{-3}$ cm$^2$/V·s, and the n-channel threshold voltage is about +40V. The asymmetry of device characteristics may be related to the fact that the HOMO energy of $\alpha$-6T almost exactly matches the work function of Au, but that the LUMO energy of $C_{60}$ matches the Au work function only relatively poorly, with a potential barrier of >1V existing between the work function and the LUMO level. It is however expected that optimization of the contact metallization and device geometry will reduce both the n-channel threshold voltage and the n-channel source-drain offset voltage.

Complementary circuits that utilize conventional (i.e., Si-based) transistors are well known, and are known to be capable of operation with low power dissipation, see, for instance, W. N. Carr et al., "MOS/LSI Design and Applications", McGraw-Hill, especially pp. 77–78. In conventional complementary circuits it is predetermined (through choice of dopant) which transistor will be n-channel and which will be p-channel.

Transistors according to the invention can be either p-channel or n-channel, depending on the applied bias, and thus can provide the circuit designer an additional degree of freedom, since a given transistor can be a p-channel device under one set of bias conditions, and a n-channel device under another set of bias conditions.

Figure 18:
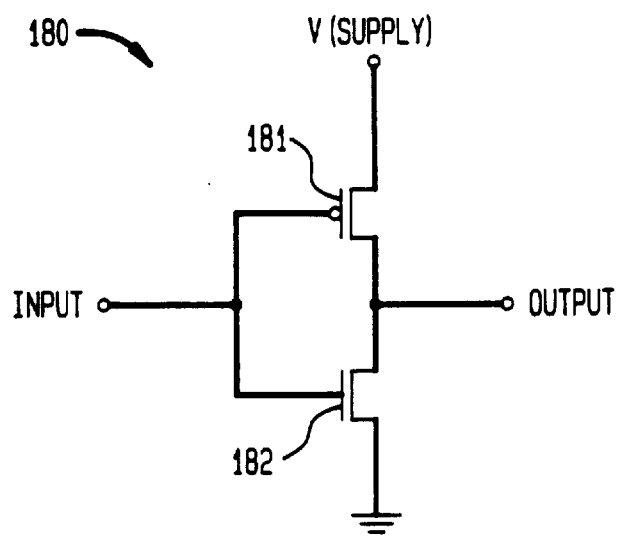
FIG. 18 schematically shows an exemplary circuit comprising n- and p-channel transistors according to the invention.

FIG. 18 schematically shows an exemplary complementary circuit, an inverter, that comprises two substantially identical transistors according to the invention, with one of the transistors operating as an n-channel device and the other operating as a p-channel device.

Example: A thermally oxidized n-type Si wafer ($SiO_2$ thickness ~0.3 m) was carefully cleaned in acetone and methanol, followed by a rinse in DI water. The $SiO_2$ was removed from predetermined portions of the wafer in conventional manner by etching in buffered oxide etch (BOE) solution. Gold contact pads were deposited on predetermined portions of both the exposed Si and the $SiO_2$ in conventional fashion, with the pads on the Si to function as gate contact, and the pads on the $SiO_2$ to function as source and drain contacts, all in a TFT substantially as shown in FIG. 11. Gate lengths were between 1.5 and 25 $\mu$m, and the pad width was 250 $\mu$m. The thus prepared wafer was loaded into a thermal evaporator (base pressure $<10^{-6}$ Torr). A quantity of $\alpha$-6T, prepared and purified substantially as disclosed in U.S. patent application Ser. No. 08/353,032, was present in the evaporator, as was a quantity of $C_{60}$, prepared substantially as disclosed in R. C. Haddon et al., ACS Symposium Series No. 481 (1992), p. 71, and in the above cited '221 U.S. patent application. A 15 nm film of $\alpha$-6T was first sublimed over the substrate, followed by sublimation of a 40 nm film of $C_{60}$, both at rates in the range 0.5–10 nm/s. Deposition of the $C_{60}$ film was followed by sublimation of a 45 nm film of $\alpha$-6T to protect the $C_{60}$ from the ambient. We have found that exposure to oxygen leads to degradation of transport properties in $C_{60}$, and may lead to such degradation also in other n-type semiconductors.

Figure 17:
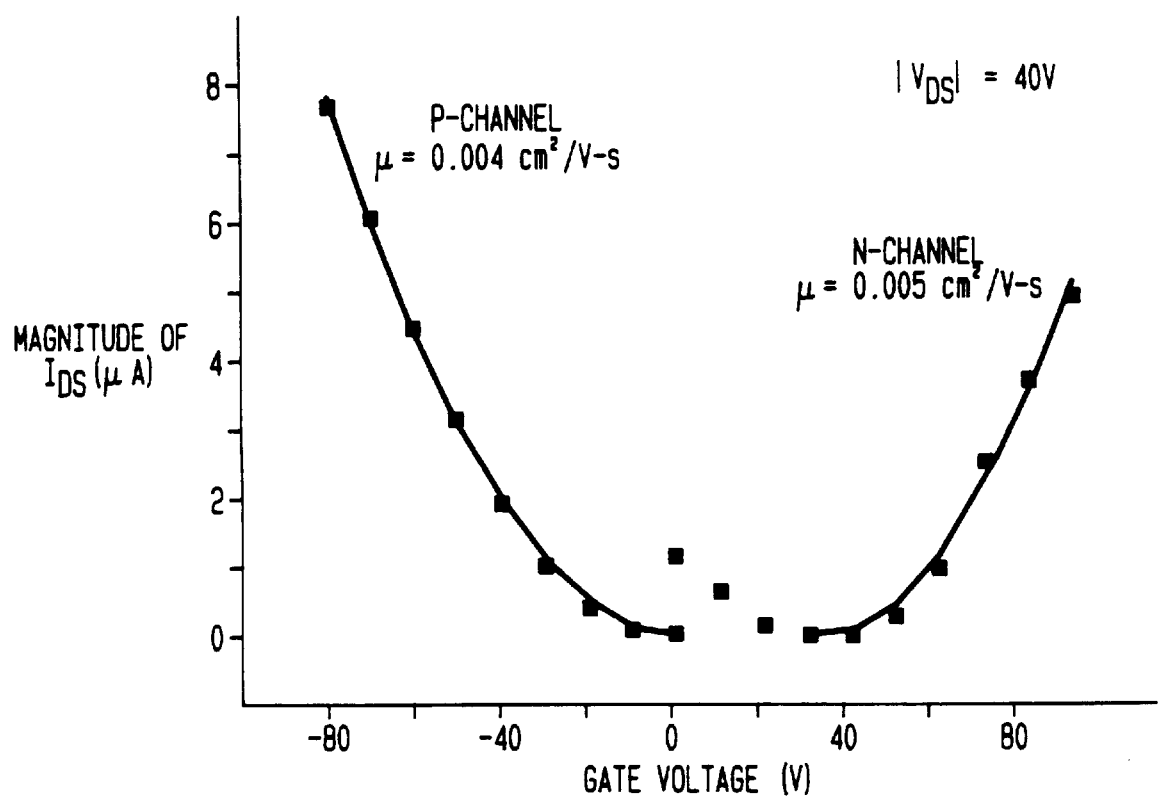
FIG. 17 shows further transistor characteristics.

Subsequent to the deposition of the protective (electrically inactive) $\alpha$-6T film, the wafer was removed from the evaporation chamber and quickly loaded into a vacuum probe station for transistor characterization. FIGS. 15–17 show characteristics of a particular one of the thus produced TFTs.

The invention claimed is:

1. An article comprising a thin film transistor comprising
   a) a quantity of organic material;
   b) spaced apart source and drain contacts in contact with said quantity of organic material;
   c) a gate contact that is spaced from each of said source and drain contacts; and
   d) the quantity of organic material comprises a layer that comprises a p-type organic material and a layer that comprises n-type organic material, said layers being in contact with each other at least in a region between the source and drain contacts;

CHARACTERIZED IN THAT
   e) the article comprises at least two essentially identical ones of said thin film transistors, and further comprises one or more conductive connections between said two thin film transistors; and
   f) the article further comprises means for biasing one of said two thin film transistors to form a p-channel transistor, and means for biasing the other of said two thin film transistors to form an n-channel transistor.

2. Article according to claim 1, wherein the p-type and n-type organic materials are selected such that the LUMO and HOMO of the p-type organic material is closer to a vacuum energy level than the HOMO of the n-type organic material, where "LUMO" and "HOMO" mean "lowest unoccupied molecular orbital" and "highest occupied molecular orbital", respectively.

3. Article according to claim 2, wherein the p-type organic material is selected from the group consisting of polymers of thiophene of degree of polymerization greater than 3 and less than 9, polymers of substituted derivatives of thiophine, poly(thienylenevinylene), and 2,2'-bis(benzo[1,2-b: 4,5-b'] dithiophene.

4. Article according to claim 2, wherein the n-type organic material is selected from the group consisting of the fullerines, perylene tetracarboxylic anhydrides and imides and their substituted derivatives, oxadiazole compounds, tetracyanoquinodimethanes and dibenzo derivatives thereof, porphyrins and quinones.

5. Article according to claim 2, wherein the p-type organic material is $\alpha$-6T and the n-type organic material is $C_{60}$.

6. Article according to claim 1, wherein the p-type organic material is in contact with said source and drain contacts.

7. Article according to claim 5, wherein the $\alpha$-6T layer is at most 20 nm thick, and the $C_{60}$ layer is between 20 and 40 nm thick.

8. Article according to claim 1, further comprising a quantity of material or combination of materials disposed on one of said layers of organic material and selected to essentially prevent contact of an ambient atmosphere with said layers of organic material.

9. Article according to claim 1, wherein said two thin film transistors form an inverter circuit.

10. Article according to claim 1, wherein said layers that respectively comprise p-type and n-type organic material respectively consist essentially of said p-type and n-type organic material.

* * * * *